US005216801A

United States Patent [19]

Knapp

[11] Patent Number: 5,216,801

[45] Date of Patent: Jun. 8, 1993

[54] TOOL FOR ASSISTING IN THE INSTALLATION AND REMOVAL OF AN ELECTRICAL TERMINATOR RELATIVE TO AN ELECTRICAL BUSHING

[75] Inventor: Todd K. Knapp, Waukesha, Wis.

[73] Assignee: Cooper Power Systems, Inc., Houston, Tex.

[21] Appl. No.: 804,686

[22] Filed: Dec. 11, 1991

[51] Int. Cl.[5] .............................................. H05K 13/00

[52] U.S. Cl. ........................................ 29/758; 29/267; 29/764

[58] Field of Search ....................... 29/764, 758, 426.5, 29/267

[56] References Cited

U.S. PATENT DOCUMENTS 4,122,599 10/1978 Luncyz ............................ 29/764 X 4,598,452 7/1986 Iseki ................................. 29/267 X

*Primary Examiner*—Carl E. Hall

*Attorney, Agent, or Firm*—Burns, Doane, Swecker & Mathis

[57] ABSTRACT

A tool for aiding in the insertion and removal of an elbow terminator relative to an electrical bushing comprises a frame which is attachable to a fixed coupling element disposed adjacent the bushing, and a handle which is pivoted on a mounting pin of the frame. The handle is also slidable along the mounting pin to enable a drive pin carried by the handle to enter an eye affixed at the rear of the elbow. By rotating the handle selectively in opposite directions, the drive pin pushes the elbow into the bushing, or pulls the elbow out of the bushing, with a mechanical advantage.

11 Claims, 2 Drawing Sheets

FIG. 3
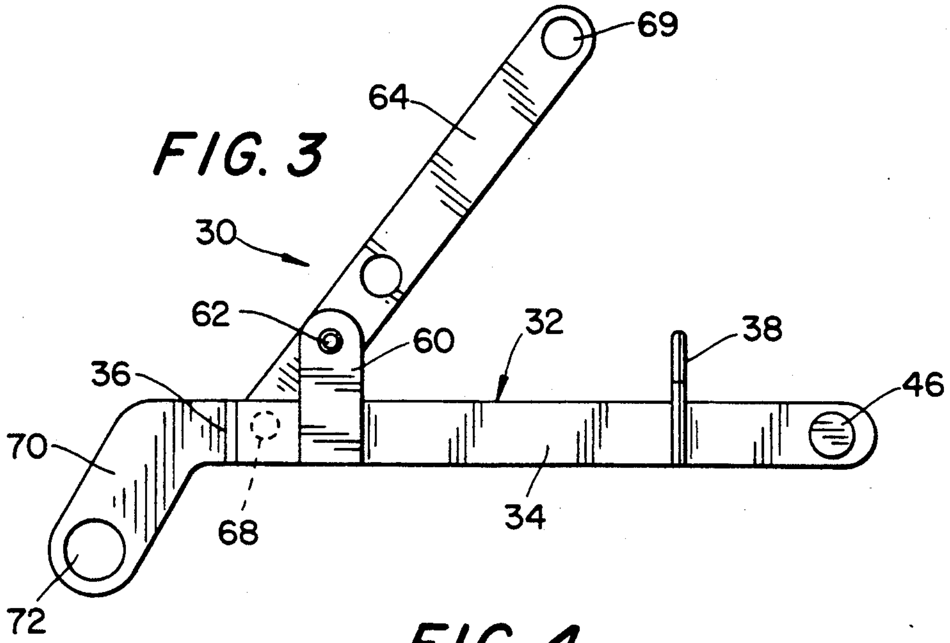
FIG. 4
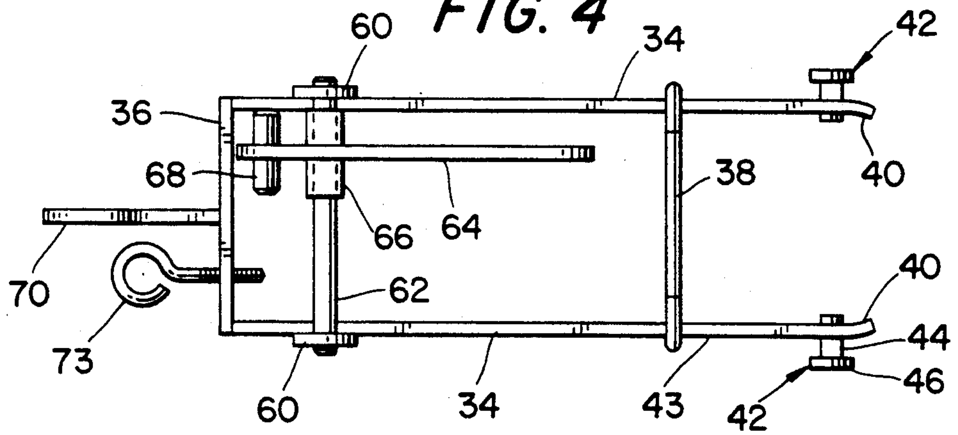
FIG. 5
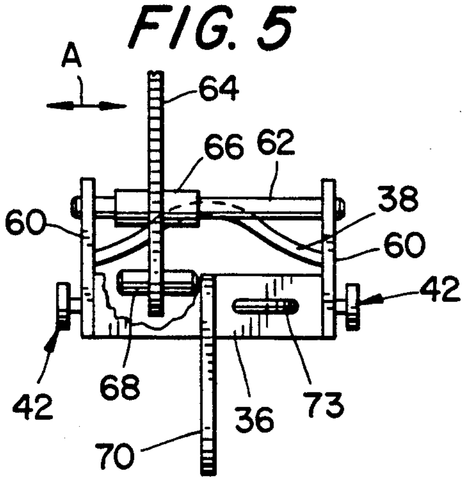
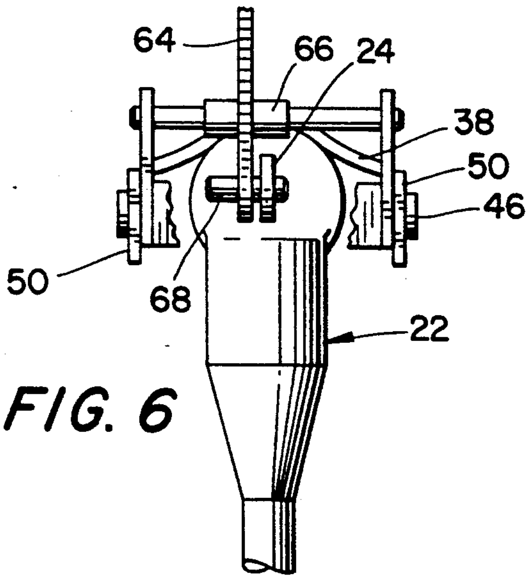
FIG. 6

TOOL FOR ASSISTING IN THE INSTALLATION AND REMOVAL OF AN ELECTRICAL TERMINATOR RELATIVE TO AN ELECTRICAL BUSHING

BACKGROUND OF THE INVENTION

The present invention relates to the installation and/or removal of an electrical terminator (such as an elbow terminator), relative to an electrical bushing, and especially to a tool for augmenting a force manually applied in order to effect such installation and/or removal.

Electrical distribution equipment, such as transformers, typically include electrical bushings which must be connected to electrical cables leading to external electrical equipment. The bushings are mounted in a wall of the electrical equipment and have their outer ends arranged to be connected to the electrical cables. One type of connector used for this purpose is an elbow terminator. The elbow and bushing are to be mated, and held releasably together by an internal annular ring-and-groove coupling. A proper mating of the elbow and bushing to bring the ring into engagement with the groove can require considerable force. That is also the case when it is desired to remove the elbow. In fact, after a prolonged period of attachment, a strong bond can develop between the elbow and bushing which is extremely difficult to overcome.

The amount of force necessary to install and remove an elbow relative to a bushing is of concern, because traditionally those operations have been performed by manual effort. Although tools, e.g., so-called shotgun sticks, have been used to position the elbow in alignment with the bushing, the actual insertion and removal effort is performed manually by an operator. The purpose of the shotgun stick is to enable the operator to manipulate the elbow from a safe distance, i.e., in isolation from the electrical current.

Tools have been previously proposed to provide a force which aids in the removal of a stuck or seized-on elbow, but such devices have been of limited use, because (1) they are not able to assist in the installation of an elbow, and (2) they require, for operation, that the transformer wall include a flat contact area in the immediate vicinity of the bushing, which flat contact area is not present in all transformers.

It would be desirable, therefore, to provide a tool which will augment manual forces applied during both the installation and removal of electrical terminators, and which does not require the presence of a flat contact area on the transformer wall.

SUMMARY OF THE INVENTION

The present invention involves a tool for facilitating the installation and removal of an electrical terminator relative to an electrical bushing. The tool comprises a frame having front and rear ends spaced apart in a longitudinal direction. The front end is attachable to a fixed coupling member located adjacent the housing. An operating handle is pivotably mounted to the frame at a location rearwardly of the front end for rotation about an axis extending transversely of the longitudinal direction. A drive member is operably connected to one end of the handle and is insertable into engagement with a connector disposed adjacent a rear end of the terminator. The handle is arranged such that a first force applied to the end of the handle located opposite the drive element causes the handle to rotate about the transverse axis and apply a greater second force to the terminator, whereby rotation of the handle in one direction produces a second force tending to push the terminator into the bushing, and rotation of the handle in the other direction produces a second force tending to pull the terminator out of the bushing.

Preferably, the transverse axis is defined by a transverse mounting pin, and the handle is rotatable on the mounting pin and is also slidable therealong in order to enable the drive element to enter a transversely opening hole in the terminator.

The frame preferably comprises a pair of parallel legs, and a support member mounted on the legs for being seated on the terminator. The front ends of the legs carry guides which are removably insertable into respective receiver brackets disposed adjacent the bushing to enable the frame to swing upwardly and downwardly relative to the bushing.

BRIEF DESCRIPTION OF THE DRAWINGS

The objects and advantages of the invention will become apparent from the following detailed description of a preferred embodiment thereof in connection with the accompanying drawings, in which like numerals designate like elements, and in which:

FIG. 3 is a side elevational view of the tool depicted in FIG. 2;

FIG. 4 is a top plan view of the tool;

FIG. 5 is a rear end view of the tool; and

FIG. 6 is a rear end view of the tool mounted on the elbow, with a rear cross bar of the tool broken away to reveal a drive connection between a handle of the tool and the eye of the elbow.

DETAILED DESCRIPTION OF A PREFERRED EMBODIMENT OF THE INVENTION

Figure 1:
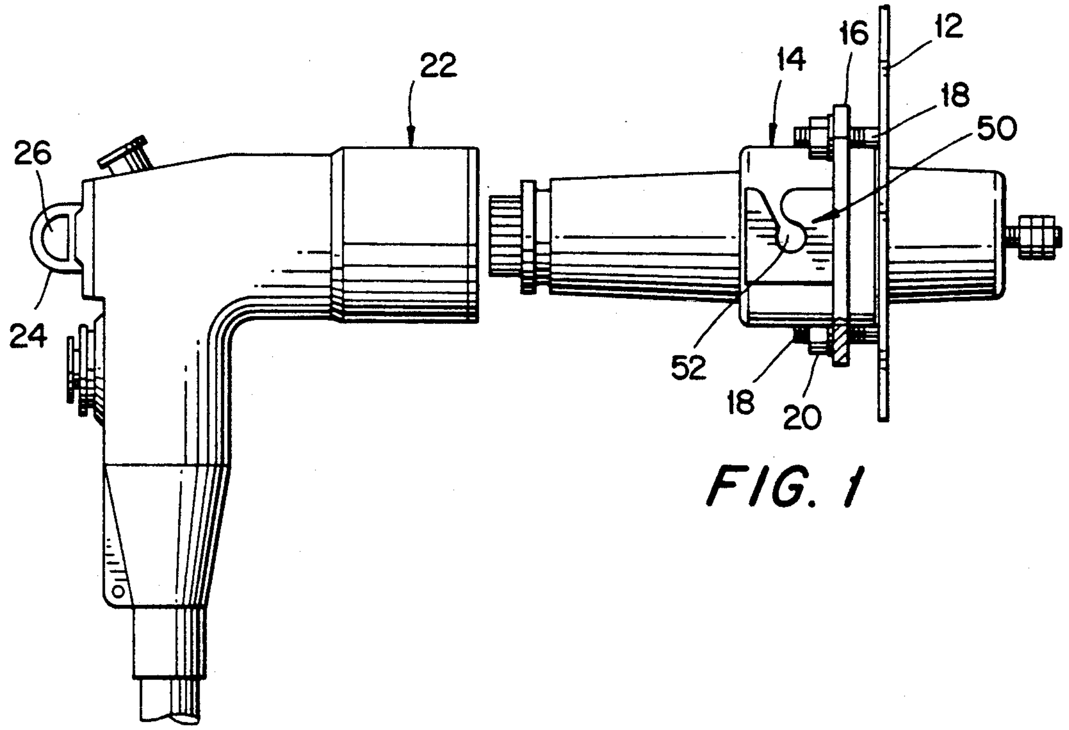
FIG. 1 is a side elevational view depicting an elbow terminator positioned in alignment with a bushing, with a rear end portion of the elbow being broken away to depict an eye of the terminator.

Depicted in FIG. 1 is an electrical bushing 14 mounted in a wall 12 of a transformer or other types of electrical equipment. The bushing 14 includes a clamp plate 16 which is mounted on a plurality of threaded posts 18 carried by the wall 12. By means of threaded nuts 20, the plate 16 (and thus the bushing 14) can be secured to the posts.

A conventional elbow terminator 22 is shown in a position in which it is aligned with the bushing 14. The elbow 22 includes an eye 24 at its rear end (see also FIG. 6). That eye 24 forms a hole 26 enabling the elbow 22 to be attached to a conventional tool such as a shotgun stick (not shown) which, as described earlier herein, is operable to position the elbow 22 in alignment with the bushing 14, whereupon an operator can manually push the elbow into the bushing.

Depicted in FIGS. 2–6 is a preferred embodiment of a tool 30 according to the present invention for augmenting the manual force required for installing and removing the elbow 22 relative to the bushing 14. That tool 30 includes a frame 32 comprised of a pair of parallel legs 34 which are spaced apart by a distance slightly larger than the cross-sectional dimension of the elbow 22. The legs 34 are joined at their rear ends by a cross-bar 36. A support rod 38 extends between the legs 34 at a location intermediate the front and rear ends of the legs. The ends of the support rod 38 are fixedly secured to the legs 34, e.g., by welding. The center portion of the support rod 38 is curved so as to be engageable with a correspondingly curved upper surface of the elbow.

The front ends 40 of the legs 34 are bent slightly inwardly, i.e., toward one another. Situated immediately rearwardly of those bent ends are two guides 42 each projecting laterally outwardly from an outer surface 43 of a respective leg 34. Each guide 42 includes a shank 44 of rectangular cross-section and an enlarged guide tab 46 mounted at the end of the shank so as to be spaced from the outer surface 43 of the respective leg 34.

The guides 42 are configured to be received in a coupling member in the form of two receiver brackets 50 which are welded to the clamp plate 16 on opposite sides of the bushing 14. Each receiver bracket 50 includes an inclined slot 52 which opens upwardly. That slot is wide enough to slidably receive the shank 44, but is narrower than the guide tab 46. When the guides 42 have been inserted into the receiver brackets 50, the frame 32 is adapted to pivot in a vertical plane about a horizontal axis defined by the shanks 44.

Extending upwardly from each of the legs 34 at a location spaced forwardly from the cross-bar 36 is a flange 60. A transverse mounting pin 62 extends horizontally between upper ends of the flanges 60. An operating handle 64 is mounted on the mounting pin 62 by means of a sleeve 66 which is affixed to the handle 64 and is loosely mounted on the mounting pin. The handle is thus free to slide horizontally to the right or left on the mounting pin 62 in the direction of the arrow A in FIG. 5, as well as free to rotate about the axis of the mounting pin 62 in a vertical plane (i.e., free to rotate in the direction of arrow B in FIG. 2). A drive pin 68 is fixedly carried at a lower end of the handle 64 to extend parallel to the mounting pin 62 in both directions from the handle 64. A hole 69 is disposed in the handle adjacent an upper end thereof to enable a shotgun stick to be connected to the tool, if desired.

A mounting arm 70 projects rearwardly from the cross bar 36. That arm 70 includes a hole 72 to enable the tool to be attached to a conventional shotgun stick, if desired.

A threaded bolt 73 is adjustably connected to the cross bar 36. By rotating the bolt 73, the bolt can be displaced into engagement with the rear end of the elbow to permanently affix the tool to the elbow. Hence, the tool will prevent accidental removal of the elbow from the bushing.

Figure 2:
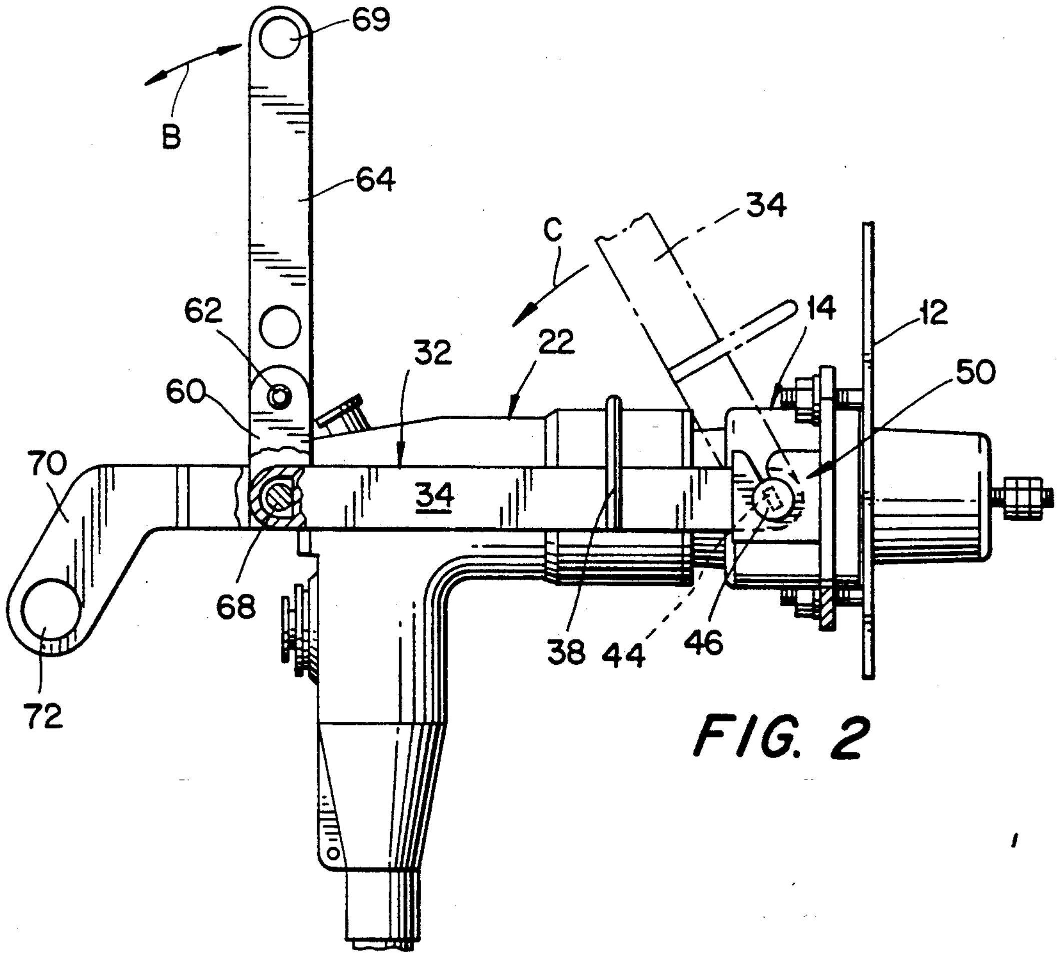
FIG. 2 is a view similar to FIG. 1 with the elbow mounted in the bushing, and with a tool according to the present invention arranged in position for assisting in the insertion of the elbow.

In operation, when it is desired to remove the elbow 22 from the bushing 14, the tool 30 is mounted to the bushing by inserting the shanks 44 into the slots 52 of the receiver brackets 50, as depicted in broken lines in FIG. 2. From that position, the tool can be swung downwardly in the direction of arrow C of FIG. 2, until the support rod 38 comes to rest against the upper surface of the elbow, as depicted in solid lines in FIG. 2.

Then, the handle 64 is slid horizontally (in either direction) along the mounting pin 62 to cause the drive pin 68 to enter the hole 26 of the eye 24 of the elbow 22, as shown in FIG. 6. By then rotating the handle in a clockwise direction (when viewed in FIG. 2), the drive pin 68 acting on the eye 24 will pull the elbow to the left and out of the bushing 14. This can be accomplished with minimal effort, due to the mechanical advantage provided by the handle 64 which acts as a lever pivoting about a fulcrum defined by the mounting pin 62. Since the distance between the mounting pin 62 and the upper end of the handle is longer than the distance between the mounting pin 62 and the drive pin 68, the application of a first force to the upper end of the handle will result in the lower end of the handle applying a second force to the elbow 22, which second force will be greater than the first force and directed oppositely thereto. The manipulation of the tool into the receiver brackets 50 and the subsequent manipulation of the handle 64 is performed by the operator either with or without the use of a shotgun stick.

Likewise, when it is desired to insert the elbow 22 into the bushing 14, the elbow is first manually fitted into the bushing with or without the aid of a conventional shotgun stick. The tool 30 is then mounted to the receiver brackets 50 in the manner described above; and the handle 64 is rotated in a counterclockwise direction (when seen in FIG. 2). Accordingly, the drive pin 68 will drive the elbow terminator 22 fully into the bushing 14.

The tool 30 can be used not only to install and remove elbows relative to bushings which are mounted separately to a transformer wall 12, but also relative to bushings which are mounted as a group on a common elongated plate, which plate is to be attached to electrical equipment or to a wall. In such a case, the tool would be attached sequentially to pairs of receiver brackets mounted on the elongated plate, and operated to install all of the elbows to the bushings.

Although the present invention has been described in connection with a preferred embodiment thereof, it will be appreciated by those skilled in the art that additions, deletions, modifications, and substitutions not specifically described may be made without departing from the spirit and scope of the invention as defined in the appended claims.

What is claimed is:

1. A tool for facilitating the installation and removal of an electrical terminator relative to an electrical bushing comprising:

a frame having front and rear ends spaced apart in a longitudinal direction, said front end being attachable to a fixed coupling member located adjacent said bushing, said frame including a pair of parallel legs extending in said longitudinal direction and arranged to be disposed along opposite sides of a terminator.

an operating handle pivotably mounted to said frame at a location rearwardly of said front end for rotation about a transverse axis extending transversely of said longitudinal direction, a drive element operably connected to one end of said handle for rotation therewith about said transverse axis, said drive element arranged between said legs for engaging a rear end of said terminator, said handle being arranged such that a first force applied to the end of said handle located opposite said drive element causes said handle to rotate about said axis and apply a greater second force to said rear end of said terminator, such that rotation of said handle in one direction produces a second force tending to push said terminator into said bushing, and rotation of said handle in the other direction produces a second force tending to pull said terminator out of said bushing.

2. A tool according to claim 1, wherein said axis is defined by a transverse mounting pin, said handle being rotatable on said mounting pin and slidable transversely along said mounting pin to enable said drive element to enter a transversely opening hole in said terminator.

3. A tool according to claim 2, wherein said drive element comprises a drive pin projecting transversely from said handle.

4. A tool according to claim 3, wherein said drive pin projects in opposite transverse directions from said handle.

5. A too according to claim 1, wherein said frame comprises a support member mounted on said legs for being seated upon said terminator.

6. A tool according to claim 5, wherein the front ends of said legs carry guides which are removably insertable into respective receiver brackets disposed adjacent said bushing to enable said frame to swing upwardly and downwardly to said bushing.

7. A tool according to claim 1, wherein said frame includes a mounting arm for connecting said frame to a shotgun stick.

8. A tool according to claim 1, wherein said frame includes means for connecting said frame permanently to said terminator.

9. A tool according to claim 1, wherein said terminator comprises an elbow terminator.

10. A tool according to claim 1, wherein said legs lie in a common plane arranged parallel to said transverse axis, said drive element lying within said plane when engaging said rear end of said terminator.

11. A tool for facilitating the installation and removal of an electrical terminator relative to an electrical bushing comprising:

a frame having front and rear ends spaced apart in a longitudinal direction, said front end being attachable to a fixed coupling member located adjacent said bushing, said frame including a transverse mounting pin defining a transverse axis, extending transversely of said longitudinal direction, an operating handle pivotably mounted to said frame at a location rearwardly of said front end for rotation about said transverse axis, and a drive element operably connected to one end of said handle, said handle being rotatably on said mounting pin and slidable transversely along said mounting pin to enable said drive element to enter a transversely opening hole disposed adjacent a rear end of said terminator, said handle being arranged such that a first force applied to the end of said handle located opposite said drive element causes sad handle to rotate about said axis and apply a greater second force to said terminator, such that rotation of said handle in one direction produces a second force tending to push said terminator into said bushing, and rotation of said handle in the other direction produces a second force tending to pull said terminator out of said bushing.

* * * * *